United States Patent

Azumi et al.

[11] Patent Number: 5,923,140
[45] Date of Patent: Jul. 13, 1999

[54] DETECTING DEVICE FOR DETECTING THE TRAVELING STATE OF A MOVING OBJECT

[75] Inventors: Shinichi Azumi, Yamatotakada; Kouji Yamaji, Kyoto, both of Japan

[73] Assignee: Sharp Kabushiki Kaisha, Osaka, Japan

[21] Appl. No.: 08/907,887

[22] Filed: Aug. 11, 1997

[30] Foreign Application Priority Data

Oct. 9, 1996 [JP] Japan .................................. 8-268076

[51] Int. Cl.$^6$ .......................... H01L 31/12; G03G 21/00
[52] U.S. Cl. ......................... 318/640; 318/560; 399/21; 399/45; 399/389; 399/150
[58] Field of Search ................... 318/560–646; 399/21, 45, 389, 149, 150, 129, 174–176, 100; 271/290, 298, 176; 414/274

[56] References Cited

U.S. PATENT DOCUMENTS 5,329,119  7/1994  Swartz .
5,652,943  7/1997  Matsuo ...................................... 399/21
5,754,925  5/1998  Yui et al. ................................ 399/150

FOREIGN PATENT DOCUMENTS 9030682  2/1997  Japan .

OTHER PUBLICATIONS

Patent Abstracts of Japan—58 033719—dated Feb. 28, 1983.

*Primary Examiner*—Paul Ip

[57] ABSTRACT

A detecting device includes: an actuator with its end placed in a conveying path of a moving object such as a sheet etc., pivotally supported by a rotary shaft so that it can sway as the moving object passes by; a slit arm integrally formed with the actuator and having a slit therein and an optical sensor disposed below the actuator. In this arrangement, the slit arm having a slit therein is placed in the path of the optical sensor. An urging portion for returning the actuator to the standby position is provided for the slit arm. The abutment surface P of the urging portion abutting the unit base of the optical sensor is formed inclined. A component force E causing the actuator to bounce, which is proportional to a repulsive force D normal to the abutment surface P when the abutment surface abuts the unit base abutment surface P, is smaller than the repulsive force D. Therefore, the distance of the bouncing of the actuator becomes smaller, thus preventing chattering.

16 Claims, 4 Drawing Sheets

DETECTING DEVICE FOR DETECTING THE TRAVELING STATE OF A MOVING OBJECT

BACKGROUND OF THE INVENTION (1) Field of the Invention

The present invention relates to a detecting device provided for detecting the state of a moving object being conveyed.

(2) Description of the Prior Art

In an image forming apparatus, a sheet-like material such as plain paper etc. is fed into the image forming position. For this operation, in order to synchronize the timing of delivering the sheet to the image forming position with the entrance of the image forming area into the image forming position, detecting devices for detecting the presence of the sheet are provided in the sheet conveying system.

A plurality of detecting devices are disposed in the above sheet conveying system. In response to the detection of the sheet by the detecting devices, the image forming and other operations are controlled while the conveyed state of the sheet in the conveying system can be detected. Therefore, it is possible to easily detect a delay in the conveyance of the sheet in the conveying system as well as sheet jam and other deficiencies, due to a conveying failure.

An example of the detecting device is constructed, as shown in FIG. 1, such that an actuator 50 having a front end placed in the sheet conveying path is pivotally supported by a rotary shaft 51 so as to be swayed or pivoted by a conveyed sheet while a slit arm 52 provided in the lower part of actuator 50 is interposed between the light emitting and receiving elements of an optical sensor 53. Slit arm 52 is integrally formed of resin with actuator 50, and is provided with a slit 52a which is of a square shape recess from the bottom thereof. A light-blocking part 52b other than slit 52a stays in the optical path of the optical sensor 53 to block the light.

In this arrangement, a sheet move the front end of actuator 50 so as to pivot actuator 50 about rotary shaft 51. This causes slit arm 52 at the bottom to rotate (or move) so that slit 52a reaches the optical path of optical sensor 53 and hence a light-reception signal is outputted. Therefore, when a sheet arrives at actuator 50, the conveyance of the sheet to that position can be detected.

Optical sensor 53 typically comprises a photo-interrupter which has light emitting and receiving elements embedded in the base part formed in a U-shape. Placed between these elements is the aforementioned slit arm 51 integrated with actuator 50. Slit arm 51 has an urging portion 55 which serves as a weight for restoring the original state after the passing of a sheet and rotationally urges actuator 50 generally in the clockwise direction shown in FIG. 1. This urging portion 55 is adapted to abut the base of optical sensor 52 to thereby constrain the rotational movement of actuator 50 and position it at a state allowing detection of a sheet to be conveyed.

Illustratively, actuator 50 when it reverts back to the original position, should be positioned exactly at the original position. For this purpose, urging portion 55 also is provided with an abutment surface, while in optical sensor 53 the unit base is configured as the positioning member therefor.

In the detecting device shown in FIG. 1, a very light actuator 50 which can sway by a slight action force when a sheet passes therethrough is used so that it can reliably operate in accordance with the passing of a sheet. It is important that actuator 50 and optical sensor 53 operate without contact with each other and actuator 50 is formed so as to be light-weighted as stated above.

However, urging portion 55 integrally formed with actuator 50 in stand-by state is at such a position as to abut the unit base of optical sensor 53, and is pivoted by the passage of a sheet, and reverts to the original stand-by position in response to the passage of the rear end of the sheet. At this moment when the abutment surface for positioning urging portion 55 instantly collides against the unit base as a positioning member of optical sensor 53, the urging portion receives a repulsive force O shown in FIG. 1 so that actuator 50 bounces in that direction. As a result, slit 52a of slit arm 52 allows the optical path of optical sensor 53 to open. Therefore, despite of no sheet passage, a light-receiving signal is outputted as if there was a sheet passage. This phenomenon is generally called 'chattering'.

Conventionally, some electrical methods have been proposed to solve the problem of chattering. One of the ideas is to delay detection during the generation of chattering.

However, such an electrical method of solving the problem of chattering will also delay the timing of actual detection. Further, extra circuit configurations are required for causing the delay, resulting in significant disadvantage in cost.

SUMMARY OF THE INVENTION

It is therefore an object of the present invention to provide a detecting device which suppresses chattering mechanically not by an electric process.

In order to achieve the above object, the present invention is configured as follows:

In accordance with the first aspect of the invention, a detecting device for detecting the traveling state of an object by triggering an actuator in accordance with the movement of the object, includes: an actuator which sways as a moving object moves; and a positioning member for positioning the actuator at the original position, and is characterized in that when the actuator is swayed as a moving object moves and then reverts back to the original position after the passing of the moving object, the actuator is adapted to abut the positioning member, and the abutment surface of the actuator is formed so that the acting direction of the repulsive force causing the actuator to bounce when the actuator abuts the positioning member differs from the direction of the movement of the actuator.

In accordance with the second aspect of the invention, the detecting device having the above first feature is characterized in that the abutment surface of the actuator is inclined with respect to the positioning member and is formed on the side face thereof so that the generated repulsive force will lie in the horizontal plane.

In accordance with the third aspect of the invention, the detecting device having the above first feature, is characterized in that the abutment surface of the actuator is inclined with respect to the positioning member and is formed on the underside thereof so that the generated repulsive force will lie in the vertical plane.

In accordance with the fourth aspect of the invention, the detecting device having the above second feature is characterized in that a rotary shaft for enabling the actuator to pivot thereabout is provided so that the rotary shaft can move in the axial direction thereof and is provided inclined upward toward the direction to which the shaft will move.

In accordance with the fifth aspect of the invention, the detecting device having the above third feature is characterized in that a rotary shaft for enabling the actuator to pivot thereabout is provided and supported so that the rotary shaft can be move in a vertical direction.

In accordance with the sixth aspect of the invention, a detecting device for detecting the traveling state of an object by triggering an actuator in accordance with the movement of the object, includes: an actuator which sways as a moving object moves; and a positioning member for positioning the actuator at the original position, and is characterized in that when the actuator is swayed as a moving object moves and then reverts back to the original position after the passing of the moving object, the actuator is adapted to abut the positioning member at two abutment surfaces, and the two abutment surfaces of the actuator are formed inclined in an opposing manner so that the acting direction of the repulsive force which is generated from each abutment surface and causes the actuator to bounce when the actuator abuts the positioning member differs from the direction of the movement of the actuator, and the component forces of the two repulsive forces deriving from the two abutment surfaces, which are orthogonal to the component force exerting the bouncing movement of the actuator, are reciprocal.

Next, the operation of the invention will be described concerning the first to fifth features of the invention.

First, as shown in FIG. 2, the abutment surface P of the actuator (1) is inclined with respect to the one side wall of the unit base (11) of the optical sensor (10) as the positioning member, receiving a repulsive force D which is normal thereto. Resultantly, the force contributing to the repulsing movement of the actuator (1) reduces to a component force E, which is notably smaller than the repulsive force D, thus making it possible to minimize the movement of the actuator in the bouncing direction. This means that the occurrence of chattering is suppressed.

The abutment surface P3 of the actuator is an inclined with respect to the positioning member (11a) as shown in FIG. 6, which is provided on the underside so that it receives a repulsive force G oriented upwards. By this arrangement, the actuator (1) will bounce due to the component force H derived from the repulsive force G. This component force H, as also is smaller than the repulsive force G, producing a minimized movement of the actuator, and hence makes it possible to suppress the generation of chattering.

Further, a rotary shaft for enabling the actuator to pivot thereabout is provided. The rotary shaft (2) is mounted so as to move in the axial direction as shown in FIG. 3 and is supported by the supporting portions (6) so that it is inclined upward toward the direction to which the rotary shaft will move. In FIG. 2, in the conventional configuration, the component force F orthogonal to the component force E which contributes to bouncing the actuator, would force the actuator (1) to move in the axial direction of the shaft and hence vibrate the actuator. In the configuration of the invention, the actuator is adapted to gradually climb up in the axial direction of the shaft, hence the kinetic energy derived from the component force F can be absorbed by this movement, thus suppressing generation of stress due to vibrations which would cause the actuator to move in the bouncing direction. In this way, it is possible to further enhance the prevention of chattering.

When, as shown in FIG. 6, a rotary shaft (2) for enabling the actuator to pivot thereabout is provided while the rotary shaft is supported by elongated slots (6a) formed in the supporting portions (6) so as to move in a vertical direction, one component force I derived from the repulsive force G, moves the actuator (1) upwards. Resultantly, the stress derived from the component force I which would generate vibrations causing the actuator to move in the bouncing direction, can be absorbed thus contributing to suppressing the generation of chattering.

Further, concerning the operation of the above sixth feature, as shown in FIG. 5, a pair of abutment surfaces P1 and P2 for positioning, are integrally formed inclined in an opposing manner in the actuator (1). When both the abutment surfaces abut (collide) against the unit base, positioning portion (11-1 and 11-2) of the optical sensor, component forces F1 and F2 corresponding to the repulsive forces D1 and D2 act in the opposite directions to each other. As a result, the kinetic energy causing the actuator to move in the axial direction of the rotary shaft is canceled out. In this way, it is possible to enhance the effect of suppressing chattering due to the bouncing of the actuator.

DESCRIPTION OF THE PREFERRED EMBODIMENTS

Figure 2:
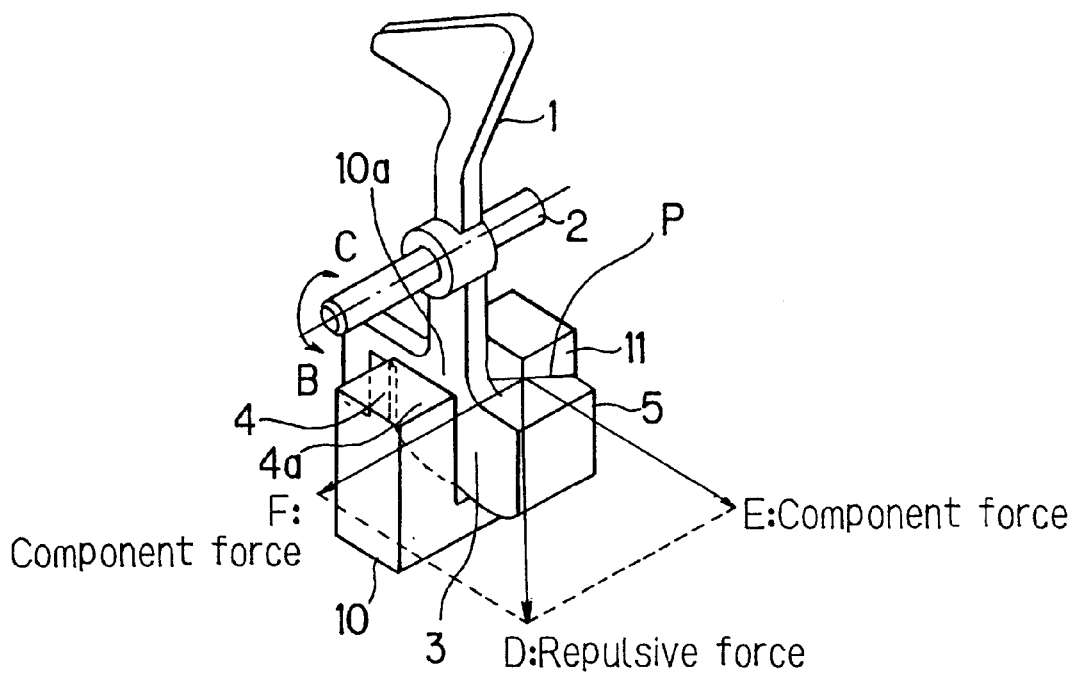
FIG. 2 is a perspective view showing the appearance of a detecting device in accordance with one embodiment of the invention.
Figure 3:
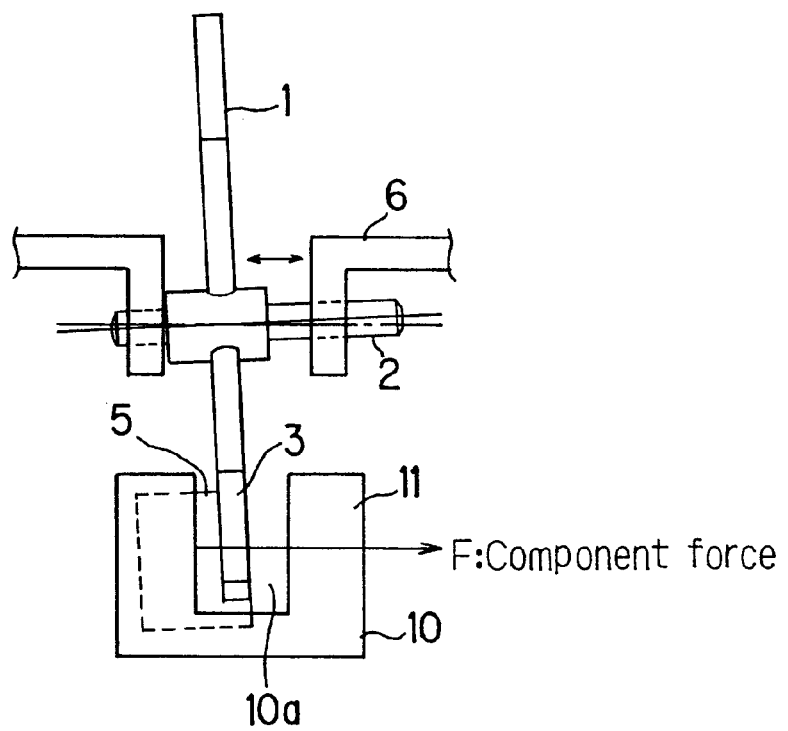
FIG. 3 is a front view showing another mode of the detecting device shown in FIG. 2.
Figure 4:
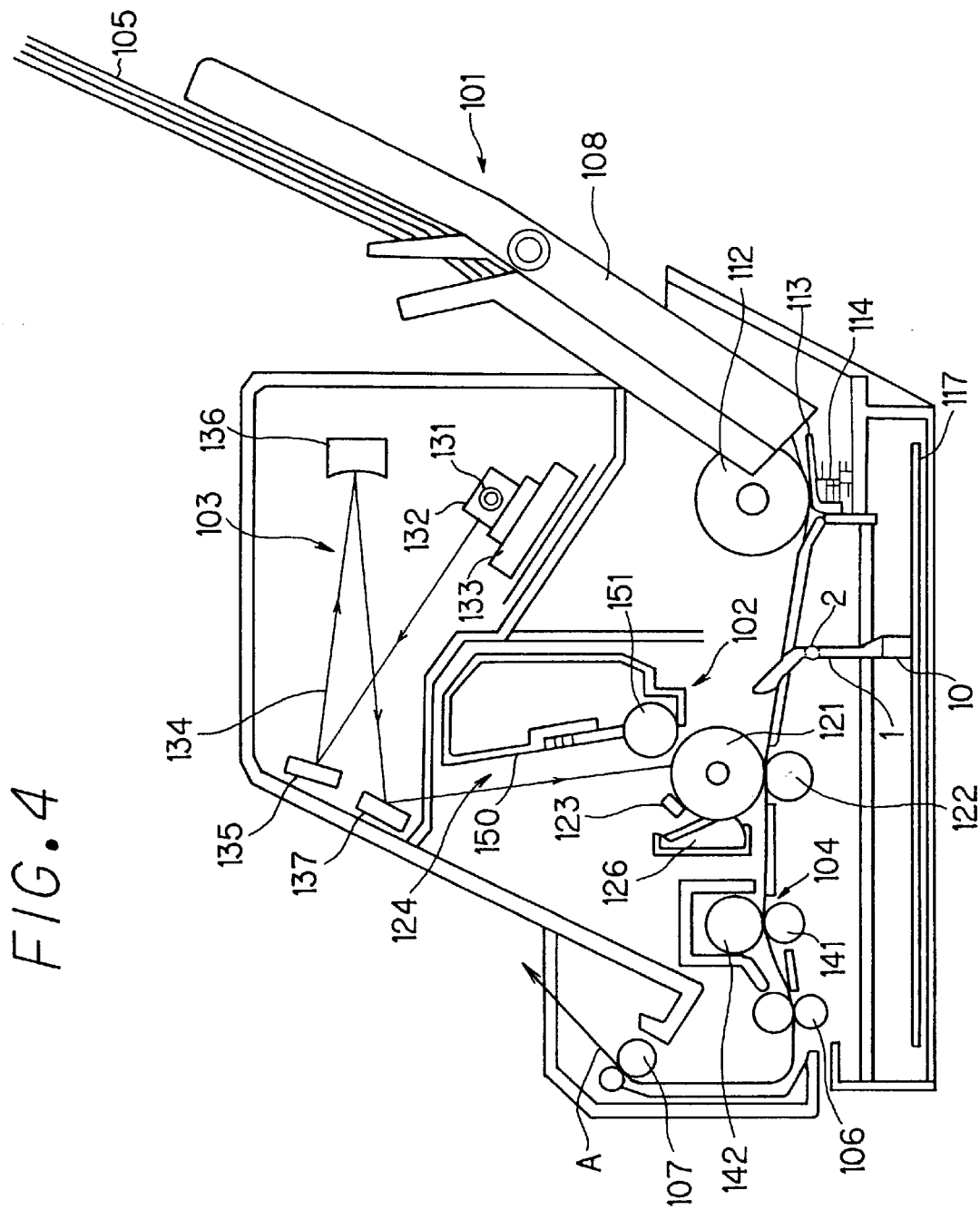
FIG. 4 is a sectional view showing an overall configuration of an image forming apparatus in which the detecting device of FIG. 2 is provided in the conveying system of the image forming apparatus.

The embodiments of the invention will be described hereinbelow in accordance with the accompanying drawings. FIG. 2 is a perspective view showing one embodiment of a sheet detecting device of the invention; FIG. 3 is a front view showing another mode of the embodiment of FIG. 2. FIG. 4 is a sectional view showing an overall configuration of an image forming apparatus in which the detecting device of the invention is provided at the position where the sheet to be conveyed is detected in the image forming apparatus.

Referring first to FIG. 4, the overall configuration of the image forming apparatus will be described. The image forming apparatus shown in FIG. 4 is a compact type laser printer.

This laser printer has a paper feeder 101, an image forming portion 102, a laser scanner 103 and a fixing unit 104. Paper feeder 101 feeds a sheet 105 one by one to image forming portion 102 inside the printer.

In image forming portion 102, a static latent image is formed on the surface of a photoreceptor drum 121, in accordance with the optical information illuminated by laser scanner 103, and the toner image corresponding to this static latent image is transferred to the sheet 105 being conveyed by the aforementioned paper feeder 101.

Fixing unit 104 fixes the toner image formed on the sheet 105 after transfer. Then, sheet 105 is discharged by means of conveyer rollers 106 and 107 outside the printer. Briefly, sheet 105 is conveyed from paper feeder 101 through a conveying path shown by a bold arrow A in the figure.

In response to print instructions, sheets 105 stacked on paper feeder 101, are supplied sheet by sheet by the actions of feed roller 112, a sheet separation frictional plate 113 and a pressure spring 114 toward the printer interior. When the fed sheet 105 pushes over an actuator 1 as a constituent of the detecting mechanism for sheet detection of the invention, an optical sensor 10 outputs an electric signal based on this information to instruct the start of image forming.

When the aforementioned sheet detecting actuator 1 is triggered, this state is detected by optical sensor 10 and the detection signal in turn activates a control circuit (board) 117. Then, this control circuit sends out an image signal to a laser diode emitter unit 131 in laser scanner 103 to perform on/off control of the light emitting diode. A scanning mirror 132 is uniformly driven at a high speed by means of a scanning mirror motor 133. Therefore, laser beam 134 scans photoreceptor drum 121 along its axial direction.

Laser beam 134 emitted from laser diode emitter unit 131 passes through reflection mirrors 135, 136 and 137 to be radiated onto photoreceptor 121 in image forming portion 102. During this, laser beam 134 selectively illuminates the surface of drum-shaped photoreceptor 121 in accordance with the on/off information from the aforementioned control circuit 117.

As a result, this laser beam 134 selectively discharges the static charge on the surface of photoreceptor 121 which has been previously uniformly electrified by means of a charger 123, thus a static latent image is formed on photoreceptor 121.

On the other hand, the toner to be used for the development is stored in a developing unit 150 in developing device 124. The toner which has been appropriately agitated and tribo-electrified in developing unit 150 adheres onto the surface of a developing roller 151. The action of an electric field generated by a developing bias voltage applied to developer roller 151 and the surface potential of photoreceptor drum 121 causes the toner to adhere to the static latent image, forming a toner image on photoreceptor 121.

Accordingly, the sheet 105 delivered from paper feeder 101 into image forming portion 102 is fed into the transfer station between photoreceptor 121 and a transfer roller 122, where the toner image created on the surface of photoreceptor 121 is transferred. Illustratively, the toner image on photoreceptor 121 is electrically attracted by the action of the electric field generated by a transfer voltage applied to transfer roller 122 so that it transfers to sheet 105.

After this transfer, some toner remaining untransferred on the surface of photoreceptor 121 is removed therefrom and collected by a cleaning unit 126.

On the other hand, sheet 105 with the toner image transferred is separated from photoreceptor 121 and then is conveyed to fixing unit 104, where it is appropriately heated and pressed by a pressing roller 141 and a heat roller 142 which is kept at a temperature of one hundred and some tens of degrees. As a result, the toner of the toner image is fused and fixed on sheet 105 forming a stable image. Sheet 105 with toner fixed thereon is conveyed by conveying rollers 106 and 107 and discharged to the outside of the apparatus.

1st Embodiment

In the image forming apparatus thus configured, the detecting device for detecting the conveyed state of the sheet, i.e., a detection sensor will be described in detail with reference to FIG. 2.

In FIG. 4, sheet 105 sent out by feed roller 121, or the front end thereof activates actuator 1 as a constituent of the detecting device. As shown in FIG. 2, actuator 1 has a rotary shaft 2 integrally formed therewith in the center thereof, and this rotary shaft 2 is rotationally supported by unillustrated supporting parts on the image forming apparatus body.

Actuator 1 has a slit arm 3 in the lower part thereof which is integrally formed like rotary shaft 2. This arm 3 is formed with a slit 4 which allows light to pass therethrough without blocking the optical path of an aftermentioned optical sensor 10. This slit 4 is formed so that the lower part is open.

Slit arm 3 in the lower part of actuator 1 has an integrally formed urging portion 5 on the opposite side of slit 4 for returning actuator 1 back to the standby position at which a sheet will be detected. This urging portion 5 is adapted to serve as a weight for actuator 1 so that the actuator has a center of gravity thereof located at a point lower than rotary shaft 2 thereof. Therefore, in FIG. 2, actuator 1 is rotated in the direction of arrow B as a sheet passes therethrough and when the swayed (rotated) state of actuator 1 is released, it gains a rotational force from urging portion 5, returning it back to the original standby position due to gravity.

Optical sensor 10 for detecting the operated (swayed) state of actuator 1 is electrically and directly connected to, and fixedly mounted on the aforementioned control circuit board 117. Optical sensor 10 is comprised of a photo interrupter provided in a U-shaped unit base 11 having an opening in the upward direction forming a space 10a in which slit arm 3 of actuator 1 is disposed. The light emitting and receiving elements are disposed at opposing positions in unit base 11 with space 10a in between, thus forming an optical path. This optical path is blocked by slit arm 3 and will be coupled when slit 4 is currently positioned therein.

In the usual state, slit arm 3 of actuator 1 stays in space 10a of optical sensor 10 with non-slit portion 4a being in the way of the optical path, or with slit 4 set away from the optical path. The rotational pressure by urging portion 5 of actuator 1 is limited by the abutment of urging portion 5 against one side wall of unit base 11 of optical sensor 10. Accordingly, actuator 1 is positioned in the state as shown in FIG. 2; this position will be the standby position for sheet detection. In the actual application, the end of actuator 1 is positioned in the sheet conveyance path, as shown in FIG. 4.

When actuator 1 reverts to the standby position after the passing of the rear of the sheet, in order to prevent chattering due to a repulsive force generated when urging portion 5 abuts (collides with) one side wall of unit base 11 of the fixed optical sensor 10, the abutment surface (designated at P) of urging portion 5 abutting unit base 11 as the positioning member of optical sensor 10 is formed slantwise. More specifically, the abutment surface P is formed inclined so that it abuts obliquely against the optical sensor with respect to the reverting direction of actuator 1.

In this way, since the surface P of urging portion 5 abutting unit base 11 of optical sensor 10 is formed inclined, the direction of the repulsive force D which is generated normal to the abutment surface P does not coincide with that of the moving (rotating) direction of actuator 1. Resultantly, the force contributing to the repulsing movement of actuator 1 reduces to a component force E. This component force is smaller than the repulsive force D acting perpendicular to the abutment surface.

Figure 1:
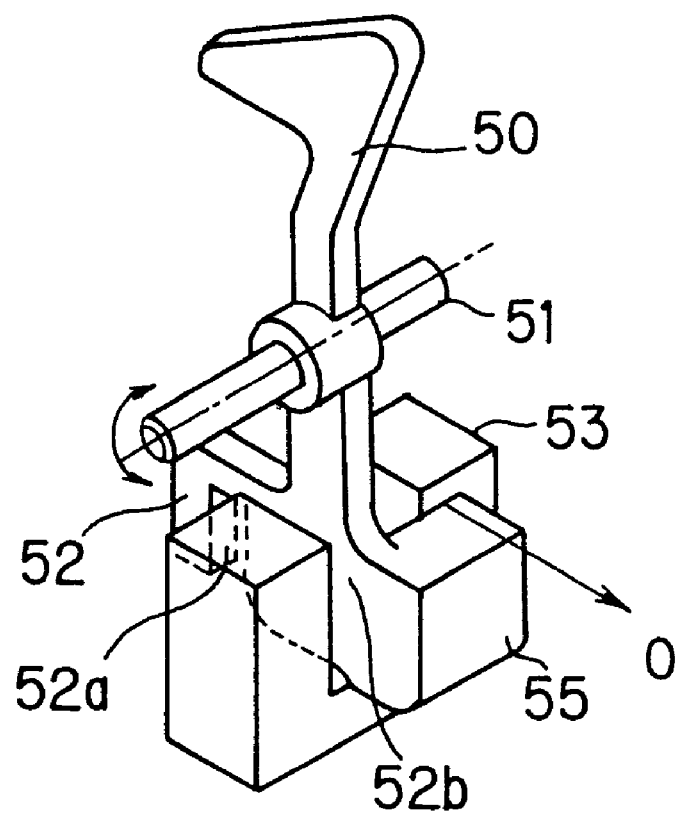
FIG. 1 is a perspective view showing the appearance of a conventional detecting device.

Accordingly, the component force E in the invention is markedly smaller than the repulsive force O, shown in the conventional example of FIG. 1, which directly acts on the actuator when it bounces, therefore the bouncing movement of actuator 1 becomes smaller. This makes it possible to avoid slit 4 formed in slit arm 3 reaching the position on the optical path where optical sensor 10 may judge that a sheet is detected. As a result, it is possible to eliminate malfunctions due to the generation of chattering.

In FIG. 2, the repulsive force D is separated into the component force E contributing to the bouncing movement of actuator 1 and another component force F which moves actuator 1 in the direction along which the rotary shaft 2 lies. This force does not cause the movement related to the bouncing movement causing chattering of actuator 1, so will not cause any chattering.

Nevertheless, the acting force causing actuator 1 to move in the direction of the force component F, may vibrate actuator 1 itself, and this stress might cause actuator 1 to move in the bouncing direction. If such vibrations can be suppressed, it is possible to completely exclude the factors causing the chattering.

To achieve this, if actuator 1 is caused to move in the direction of the force component F, it becomes possible to dissipate the kinetic energy. As the structure for this purpose, rotary shaft 2 of actuator 1 is rotatably supported by supports 6 so as to be set inclined upwards to the right as in FIG. 3, or, in such a direction that actuator 1 moves. Further, actuator 1 is placed so that it can move right when positioned by means of urging portion 5.

By the above configuration, when actuator 1 reverts to the original standby position from the operated state after the passing of the rear of the sheet, the component force F generated when urging portion 5 abuts unit base 11 of optical sensor 10, causes actuator 1 to move up, or rightwards. Thus, it is possible to absorb the component force F to eliminate the vibration of actuator 1.

Resultantly, it is possible to avoid the risk of the movement of actuator 1 in the bouncing direction due to vibrations.

Briefly, in accordance with the configuration of FIG. 3, after the passing of the rear of the sheet, one force component F of the repulsive force D, generated at the moment actuator 1 reverts, acts rightwards in the figure. Therefore, actuator 1 moves rightwards and then returns to the left due to gravity, etc. of urging portion 5. In this way, the kinetic energy of the bouncing movement due to the reverting movement of actuator 1 to the standby position is consumed as the kinetic energy for the movement in the transverse direction, thus making it possible to enhance the effect on prevention of chattering.

2nd Embodiment

Here, the aforementioned component force F is generated because urging portion 5 is adapted to abut unit base 11 of optical sensor 10 only by the single abutment surface P. If this force F or the transversally acting force is canceled out, there is no need to adopt the above configuration in which actuator 1 moves up along its axis.

Figure 5:
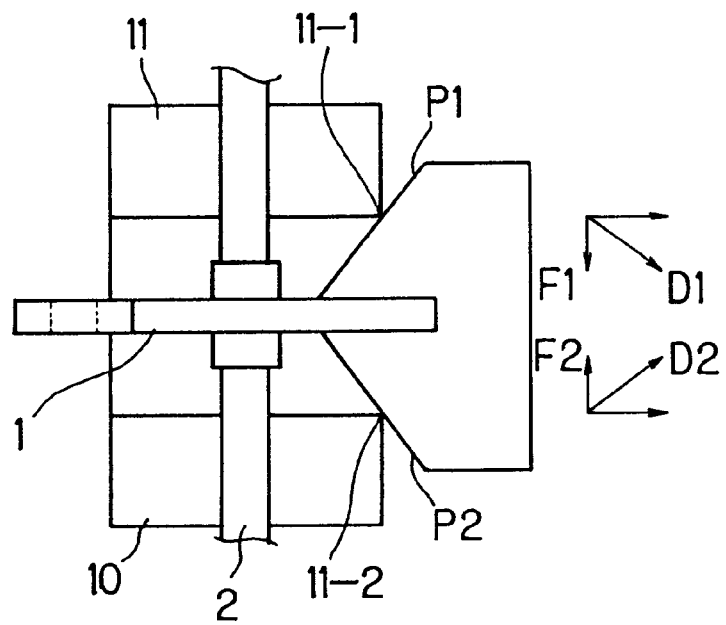
FIG. 5 is a top view showing the second embodiment of a detecting device in accordance with the invention.

FIG. 5 is a top view showing a detecting device configured so that the component force F can be canceled without adopting the configuration which allows actuator 1 to move.

As shown in FIG. 5, a pair of positioning members 11-1 and 11-2 are formed on the unit base 11 of optical sensor 10 while urging portion 5 is formed symmetrically on both sides of actuator 1 and a pair of inclined abutment surfaces P1 and P2 corresponding to the positioning members are provided.

In this configuration, component forces F1 and F2 both acting on urging portion 5 but in the opposite directions to each other are generated on the abutment surfaces P1 and P2, respectively. Since these component forces F1 and F2 cancel out each other, no force causing actuator 1 to move in the direction along which rotary shaft 2 lies will arise.

Other Embodiments

In the first embodiment shown in FIG. 2, actuator 1 for the detecting device is adapted to collide against the side wall of unit base 11 of optical sensor 10.

Figure 6:
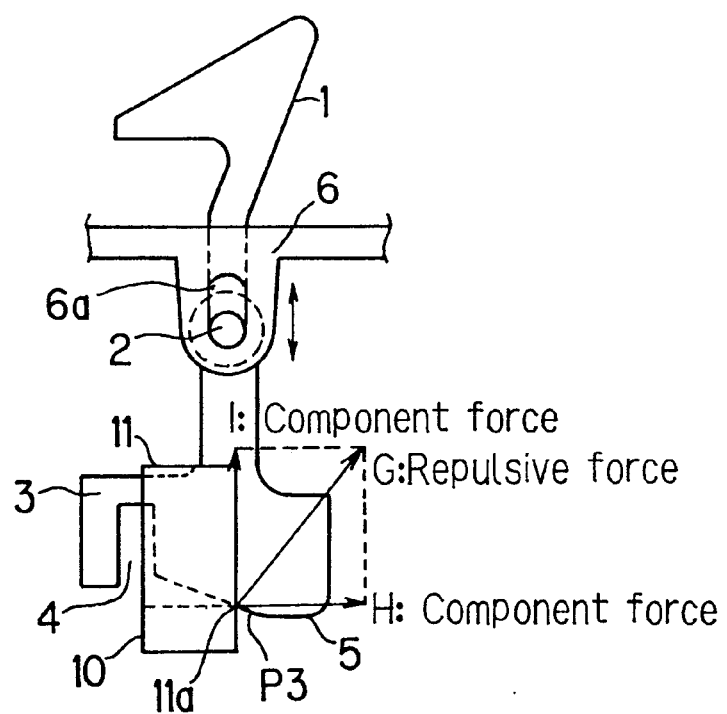
FIG. 6 is a side view showing another embodiment of a detecting device in accordance with the invention.

FIG. 6 shows another configuration of actuator 1 or especially, urging portion 5, whose positioning part to be abutted to a bottom wall 11a of unit base 11 of optical sensor 10 is formed in the lower part thereof. In this configuration, the abutment surface (positioning part) P3 abutting unit base 11 of optical sensor 10 is formed slanted on the underside of urging portion 5.

Accordingly, as in the case of FIG. 2, the repulsive force G generated normal to the abutment surface P3 does not coincide with that of the bouncing direction of actuator 1, but is oriented upwards. Resultantly, the acting force contributing to the repulsing movement of actuator 1 reduces to a component force H. This component force H is generated when actuator 1 reverts to the standby position or it collides with unit base 11 of optical sensor 10 and will provide the kinetic energy for bouncing movement. However, this component force H is smaller than the repulsive force 0 which provides the kinetic energy for bouncing movement in the case of FIG. 1. Accordingly, it is possible to avoid slit 4 of slit arm 3 integrally formed with actuator 1 reaching the position on the optical path of optical sensor 10 and hence prevent the generation of chattering.

Other component force I which exerts in the perpendicular direction to that of the component force H contributes to the kinetic energy for moving actuator 1 upwards. In order to eliminate the kinetic energy generated by this component force I so as to retard the vibration of actuator 1, actuator 1 is provided so as to move vertically. For this purpose, supporting portions 6 for supporting rotary shaft 2 of actuator 1 are provided with slots or elongated holes 6a for receiving rotary shaft 2. By this configuration, it becomes possible to absorb the aforementioned kinetic energy by moving actuator 1 upward and hence retard the vibration thereof, thus excluding all the factors of generation of chattering. Although in the above description of the embodiment, an actuator provided with a slit was exemplified, there is no reason to stick to use of a slit as long as a light blocking portion is able to open and close the optical path.

As has been described heretofore, the embodiments of the invention were described for the case where the detecting device is provided to detect the traveling state of a sheet. The detecting device of the invention, however, should not be limited to the detection of the traveling state of a sheet. The invention can be of course applied to a device for detecting the moving state of an object which is conveyed along a conveying system.

In accordance with the detecting device of the invention, it is possible to successfully prevent chattering in a mechanical manner.

Since the mechanism for preventing chattering is very simple, it is possible to readily produce the detecting device of the invention without any extra cost.

Further, as compared to the case where chattering is eliminated by an electrical process, the detection timing is made faster. Moreover, since no electric circuit etc. for preventing chattering is required, this invention is remarkably advantageous in cost.

What is claimed is:

1. A detecting device for detecting a moving state of an object by triggering an actuator in accordance with movement of the object, comprising:

an actuator including means for swaying the actuator as a moving object moves; and a positioning member for positioning the actuator at a first position which is an original position and a second position, wherein when the actuator is swayed to the second position as the moving object moves and then reverts back to the first position which is an original position after the passing of the moving object, the actuator having an abutment surface for abutting the positioning member, and the abutment surface of the actuator has a shape so that an acting direction of the repulsive force causing the actuator to bounce when the actuator abutting surface abuts the positioning member differs from a direction of the movement of the actuator, so that chattering is reduced.

2. The detecting device according to claim 1, wherein the abutment surface of the actuator is inclined with respect to the positioning member and is formed on the side face thereof so that the generated repulsive force will lie in the horizontal plane.

3. The detecting device according to claim 2, wherein a rotary shaft for enabling the actuator to pivot thereabout is provided so that the rotary shaft can move in an axial direction thereof and is provided inclined upward toward a direction to which the shaft will move.

4. The detecting device according to claim 1, wherein the abutment surface of the actuator is inclined with respect to the positioning member and is formed on the underside thereof so that the generated repulsive force will lie in the vertical plane.

5. The detecting device according to claim 4, wherein a rotary shaft for enabling the actuator to pivot thereabout is provided and supported, so that the rotary shaft can be moved in a vertical direction.

6. A detecting device for detecting a moving state of an object by triggering an actuator in accordance with the movement of the object, comprising:

an actuator located on means for allowing the actuator to sway as a the moving object moves; and a positioning member for positioning the actuator at at a first position which is an original position, and a second position wherein when the actuator is swayed as the moving object moves and then reverts back to the first position which is an original position after the passing of the moving object, the actuator has two abutment surfaces for abutting the positioning member at two abutment locations, and the two abutment surfaces of the actuator have inclined shapes opposed to each other, so that an acting direction of a repulsive force which is generated from each abutment surface causes the actuator to bounce when the actuator abuts the positioning member differs from the direction of the movement of the actuator, and the component forces of the two repulsive forces deriving from the abutment surfaces, which are orthogonal to the component force exerting the bounding movement of the actuator, are reciprocal.

7. A detecting device for detecting a moving state of an object by operation of an actuator in accordance with movement of the object, comprising:

an actuator for detecting movement of the object;

means for swaying the actuator, operatively connected to the actuator, as a moving object moves;

a positioning member for physically contacting and positioning the actuator; and mechanical means operatively connected to the actuator for preventing chattering of the device.

8. The detecting device according to claim 7, wherein the mechanical means includes at least one inclined surface on the actuator for abutting a surface of the positioning member.

9. The detecting device according to claim 8, wherein the means for swaying is a shaft and the mechanical means includes means for moving the shaft in an axial direction.

10. The detecting device according to claim 8, wherein there are two inclined surfaces of the actuator.

11. The detecting device according to claim 10, wherein the means for swaying is a shaft and the mechanical means includes means for moving the shaft in an axial direction.

12. The detecting device according to claim 10, wherein the means for swaying is a shaft and there are means for moving the shaft in a vertical direction.

13. The detecting device according to claim 12 wherein the means for moving the shaft are slots or holes in a supporting member supporting the shaft.

14. The detecting device according to claim 8, wherein the means for swaying is a shaft and there are means for moving the shaft in a vertical direction.

15. The detecting device according to claim 7, wherein the means for swaying is a shaft and the mechanical means includes means for moving the shaft in an axial direction.

16. The detecting device according to claim 7, wherein the means for swaying is a shaft and there are means for moving the shaft in a vertical direction.

* * * * *